United States Patent
Ueki

(10) Patent No.: US 10,580,698 B2
(45) Date of Patent: Mar. 3, 2020

(54) WAFER PROCESSING METHOD

(71) Applicant: DISCO CORPORATION, Tokyo OT (JP)

(72) Inventor: Atsushi Ueki, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/192,884

(22) Filed: Nov. 16, 2018

(65) Prior Publication Data
US 2019/0164832 A1 May 30, 2019

(30) Foreign Application Priority Data

Nov. 28, 2017 (JP) .................................. 2017-227847

(51) Int. Cl.
| | |
|---|---|
| *H01L 21/67* | (2006.01) |
| *H01L 21/78* | (2006.01) |
| *H01L 21/268* | (2006.01) |
| *B23K 26/00* | (2014.01) |
| *B23K 26/08* | (2014.01) |
| *B23K 26/53* | (2014.01) |
| *B23K 103/00* | (2006.01) |
| *B23K 101/40* | (2006.01) |

(52) U.S. Cl.
CPC ............ *H01L 21/78* (2013.01); *B23K 26/009* (2013.01); *B23K 26/083* (2013.01); *B23K 26/53* (2015.10); *H01L 21/268* (2013.01); *H01L 21/67115* (2013.01); *B23K 2101/40* (2018.08); *B23K 2103/56* (2018.08); *H01L 21/67092* (2013.01)

(58) Field of Classification Search
CPC . H01L 21/78; H01L 21/67115; H01L 21/268; H01L 21/67092; B23K 26/53; B23K 26/083; B23K 26/009; B23K 2101/40; B23K 2103/56
See application file for complete search history.

(56) References Cited

U.S. PATENT DOCUMENTS

2004/0241962 A1* 12/2004 Nagai ............... H01L 21/67092
438/460

FOREIGN PATENT DOCUMENTS

JP 2002192370 A 7/2002

* cited by examiner

*Primary Examiner* — Kyoung Lee
(74) *Attorney, Agent, or Firm* — Greer Burns & Crain Ltd.

(57) ABSTRACT

A wafer processing method includes a modified layer forming step of forming a modified layer along a planned dividing line within a wafer and a dividing step of dividing the wafer along the planned dividing line with the modified layer as a starting point by applying a force to the wafer. The modified layer forming step includes a forward path modified layer forming step, a backward path modified layer forming step, and a phase shift mask reversing step of reversing a phase shift mask so as to reverse phase distribution of a laser beam applied to the wafer in an X-axis direction after the forward path modified layer forming step and before the backward path modified layer forming step, or after the backward path modified layer forming step and before the forward path modified layer forming step.

3 Claims, 9 Drawing Sheets

WAFER PROCESSING METHOD

BACKGROUND OF THE INVENTION

Field of the Invention

The present invention relates to a wafer processing method that modifies the inside of a wafer by a laser beam of a wavelength transmissible through the wafer.

Description of the Related Art

In electronic apparatuses typified by mobile telephones and personal computers, device chips including devices such as integrated circuits or the like are essential constituent elements. The device chips are, for example, obtained by demarcating the front surface side of a wafer formed of a semiconductor material such as silicon or the like by a plurality of planned dividing lines (streets), forming a device in each of resulting regions, and thereafter dividing the wafer along the planned dividing lines.

As one of methods of dividing the wafer, a method is known which modifies the inside of the wafer by applying a laser beam (a transmissible laser beam) of a wavelength transmissible through the wafer from the back surface side of the wafer and condensing the laser beam within the wafer, and thus forms modified layers (modified regions) that are fragile as compared with other regions (see, for example, Japanese Patent Laid-Open No. 2002-192370). When a force is applied to the wafer after the modified layers are formed along the planned dividing lines, the wafer can be divided into a plurality of device chips with the modified layers as a starting point.

SUMMARY OF THE INVENTION

In the above-described method, a laser beam of a wavelength transmissible through the wafer is used. A part of the laser beam applied from the back surface side of the wafer therefore reaches the front surface side of the wafer without being absorbed. Hence, in a case where minute cracks randomly extend from the modified layers, for example, the laser beam reflected and dispersed by the cracks may reach the devices on the front surface side, and destroy the devices.

It is accordingly an object of the present invention to provide a novel wafer processing method that can prevent destruction of devices by a laser beam reflected and dispersed within a wafer.

In accordance with an aspect of the present invention, there is provided a wafer processing method for processing a wafer having a device formed in each region of a front surface side demarcated by a plurality of planned dividing lines, by using a laser processing apparatus, the laser processing apparatus including a chuck table configured to hold the wafer, a laser beam irradiating unit configured to form a modified layer within the wafer by irradiating the wafer held on the chuck table with a laser beam of a wavelength transmissible through the wafer, and a horizontal moving mechanism configured to move the chuck table and the laser beam irradiating unit relative to each other in an X-axis direction, the laser beam irradiating unit including a laser oscillator configured to perform pulse oscillation of the laser beam, a condenser configured to condense the laser beam oscillated by the laser oscillator and irradiate the wafer with the laser beam, and a phase shift mask disposed between the laser oscillator and the condenser, the phase shift mask forming a phase difference of 180 degrees between a part of the laser beam guided to the condenser and a remaining part of the laser beam guided to the condenser such that intensity distribution of the laser beam applied to the wafer has two peaks separated from each other in the X-axis direction, the wafer processing method including: a modified layer forming step of forming the modified layer along a planned dividing line within the wafer by moving the chuck table and the laser beam irradiating unit relative to each other in the X-axis direction while irradiating a region corresponding to the planned dividing line of the wafer with the laser beam from a back surface side of the wafer under a condition for condensing the laser beam within the wafer; and a dividing step of dividing the wafer along the planned dividing line with the modified layer as a starting point by applying a force to the wafer after the modified layer forming step is performed; the modified layer forming step including a forward path modified layer forming step of irradiating the wafer with the laser beam while moving the laser beam irradiating unit to one side in the X-axis direction relative to the chuck table, a backward path modified layer forming step of irradiating the wafer with the laser beam while moving the laser beam irradiating unit to another side in the X-axis direction relative to the chuck table, and a phase shift mask reversing step of reversing the phase shift mask so as to reverse phase distribution of the laser beam applied to the wafer in the X-axis direction after the forward path modified layer forming step and before the backward path modified layer forming step, or after the backward path modified layer forming step and before the forward path modified layer forming step.

In one mode of the present invention, in the forward path modified layer forming step, the phase shift mask may delay, by 180 degrees, a phase of the laser beam forming the peak on the other side in the X-axis direction with respect to a phase of the laser beam forming the peak on the one side in the X-axis direction, and in the backward path modified layer forming step, the phase shift mask may delay, by 180 degrees, the phase of the laser beam forming the peak on the one side in the X-axis direction with respect to the phase of the laser beam forming the peak on the other side in the X-axis direction.

In addition, in one mode of the present invention, a wavelength of the laser beam oscillated by the laser oscillator may be between 1300 nm and 1400 nm both inclusive.

In the wafer processing method according to one mode of the present invention, the laser beam irradiating unit including the phase shift mask is used, and thereby the wafer is irradiated with the laser beam of the intensity distribution having the two peaks separated from each other in the X-axis direction. It is thereby possible to prevent destruction of the devices by the laser beam reflected and dispersed within the wafer.

When a direction in which cracks extend is controlled by the two peaks of the laser beam, a possibility of the cracks extending in random directions from the modified layer is reduced, and the reflection and dispersion of the laser beam due to the random cracks are suppressed, so that destruction of the devices can be prevented.

In addition, in the wafer processing method according to one mode of the present invention, the phase shift mask is reversed so as to reverse the phase distribution of the laser beam applied to the wafer in the X-axis direction after the forward path modified layer forming step and before the backward path modified layer forming step, or after the backward path modified layer forming step and before the forward path modified layer forming step. Thus, even when the direction of relative movement between the chuck table and the laser beam irradiating unit is changed, the wafer can be processed with high precision under uniform processing conditions.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 4 is a diagram schematically depicting a state of a laser beam passing through the phase shift mask and the like;

FIG. 5 is a perspective view schematically depicting an example of a configuration of a wafer and the like;

FIG. 7 is a plan view schematically depicting the arrangement of modified layers formed in the forward path modified layer forming step and the like;

DETAILED DESCRIPTION OF THE PREFERRED EMBODIMENT

An embodiment according to one mode of the present invention will be described with reference to the accompanying drawings. A wafer processing method according to the present embodiment includes a modified layer forming step and a dividing step. In the modified layer forming step, a modified layer (modified region) along planned dividing lines is formed within a wafer by irradiating the wafer with a laser beam of an intensity distribution having two peaks separated from each other in an X-axis direction. In the dividing step, the wafer is divided along the planned dividing lines with this modified layer as a starting point. The wafer processing method according to the present embodiment will be described below in detail.

Figure 1:
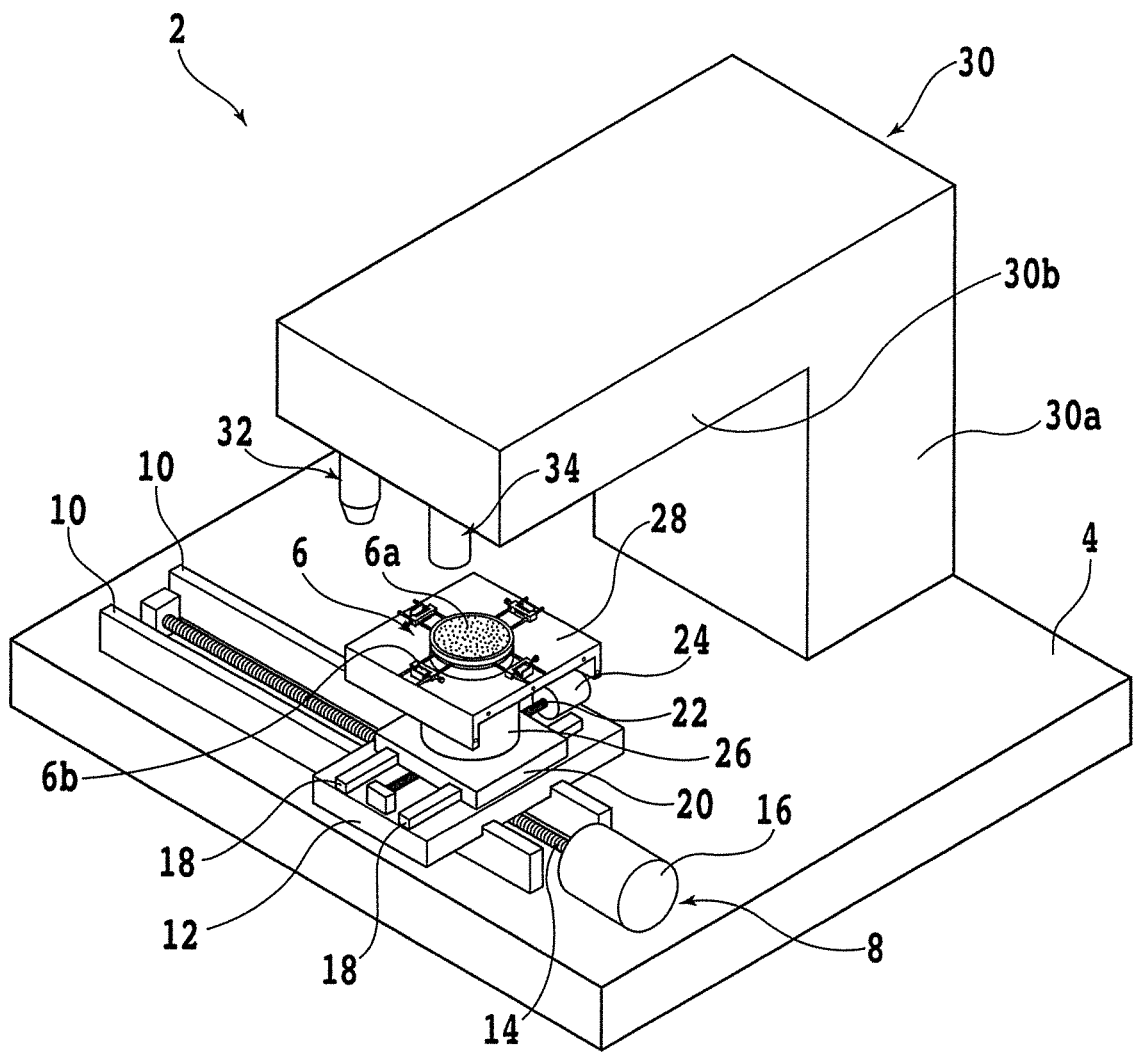
FIG. 1 is a perspective view schematically depicting an example of a configuration of a laser processing apparatus.

FIG. 1 is a perspective view schematically depicting an example of a configuration of a laser processing apparatus 2 used for the wafer processing method according to the present embodiment. As depicted in FIG. 1, the laser processing apparatus 2 has a base 4 on which constituent elements are mounted. Provided on a top surface of the base 4 is a horizontal moving mechanism (processing feeding means and indexing feeding means) 8 that moves a chuck table (holding means) 6 that sucks and holds a wafer 11 (see FIG. 5 and the like) in an X-axis direction (processing feed direction) and a Y-axis direction (indexing feed direction).

The horizontal moving mechanism 8 has a pair of X-axis guide rails 10 fixed to the top surface of the base 4 and substantially parallel with the X-axis direction. An X-axis moving table 12 is slidably attached to the X-axis guide rails 10. A nut portion (not depicted) is provided to an undersurface side (lower surface side) of the X-axis moving table 12. An X-axis ball screw 14 substantially parallel with the X-axis guide rails 10 is screwed into the nut portion.

An X-axis pulse motor 16 is coupled to one end portion of the X-axis ball screw 14. Rotating the X-axis ball screw 14 by the X-axis pulse motor 16 moves the X-axis moving table 12 in the X-axis direction along the X-axis guide rails 10. An X-axis position detecting sensor (not depicted) that detects the position of the X-axis moving table 12 in the X-axis direction is provided at a position adjacent to the X-axis guide rails 10.

A pair of Y-axis guide rails 18 substantially parallel with the Y-axis direction is fixed to a top surface (upper surface) of the X-axis moving table 12. A Y-axis moving table 20 is slidably attached to the Y-axis guide rails 18. A nut portion (not depicted) is provided to an undersurface side (lower surface side) of the Y-axis moving table 20. A Y-axis ball screw 22 substantially parallel with the Y-axis guide rails 18 is screwed into the nut portion.

A Y-axis pulse motor 24 is coupled to one end portion of the Y-axis ball screw 22. Rotating the Y-axis ball screw 22 by the Y-axis pulse motor 24 moves the Y-axis moving table 20 in the Y-axis direction along the Y-axis guide rails 18. A Y-axis position detecting sensor (not depicted) that detects the position of the Y-axis moving table 20 in the Y-axis direction is provided at a position adjacent to the Y-axis guide rails 18.

A table mount 26 is provided to a top surface side (upper surface side) of the Y-axis moving table 20. The chuck table 6 is disposed on an upper portion of the table mount 26 via a cover 28. A part of a top surface of the chuck table 6 is a holding surface 6a that sucks and holds a front surface 11a (see FIG. 5 and the like) side of the wafer 11.

The holding surface 6a is connected to a suction source (not depicted) such as an ejector or the like via a suction passage (not depicted) or the like formed within the chuck table 6. In addition, four clamps 6b for fixing an annular frame 19 (see FIG. 5 and the like) supporting the wafer 11 from four directions are provided to the periphery of the holding surface 6a. A rotation-driving source (not depicted) is coupled to the table mount 26. The chuck table 6 is rotated by the rotation-driving source about a rotation axis substantially parallel with a Z-axis direction (vertical direction).

A supporting structure 30 is provided in the rear of the horizontal moving mechanism 8. The supporting structure 30 includes a column portion 30a having a columnar shape and an arm portion 30b projecting to the horizontal moving mechanism 8 side in the Y-axis direction from an upper end of the column portion 30a. Provided to a front end side of the arm portion 30b, for example, is a laser beam irradiating unit (laser beam irradiating means) 32 that performs pulse oscillation of a laser beam and irradiates the wafer 11 on the chuck table 6 with the laser beam.

A camera 34 that images the wafer 11 held on the chuck table 6 or the like is provided at a position adjacent to the laser beam irradiating unit 32. An image formed by imaging the wafer 11 or the like by the camera 34 is, for example, used to adjust the position of the wafer 11 and the laser beam irradiating unit 32 or the like.

Constituent elements such as the chuck table 6, the horizontal moving mechanism 8 (the X-axis pulse motor 16 and the Y-axis pulse motor 24 in particular), the laser beam irradiating unit 32, the camera 34, and the like are connected to a control unit (not depicted). The control unit controls the operation of each constituent element so as to process the wafer 11 properly.

Figure 2:
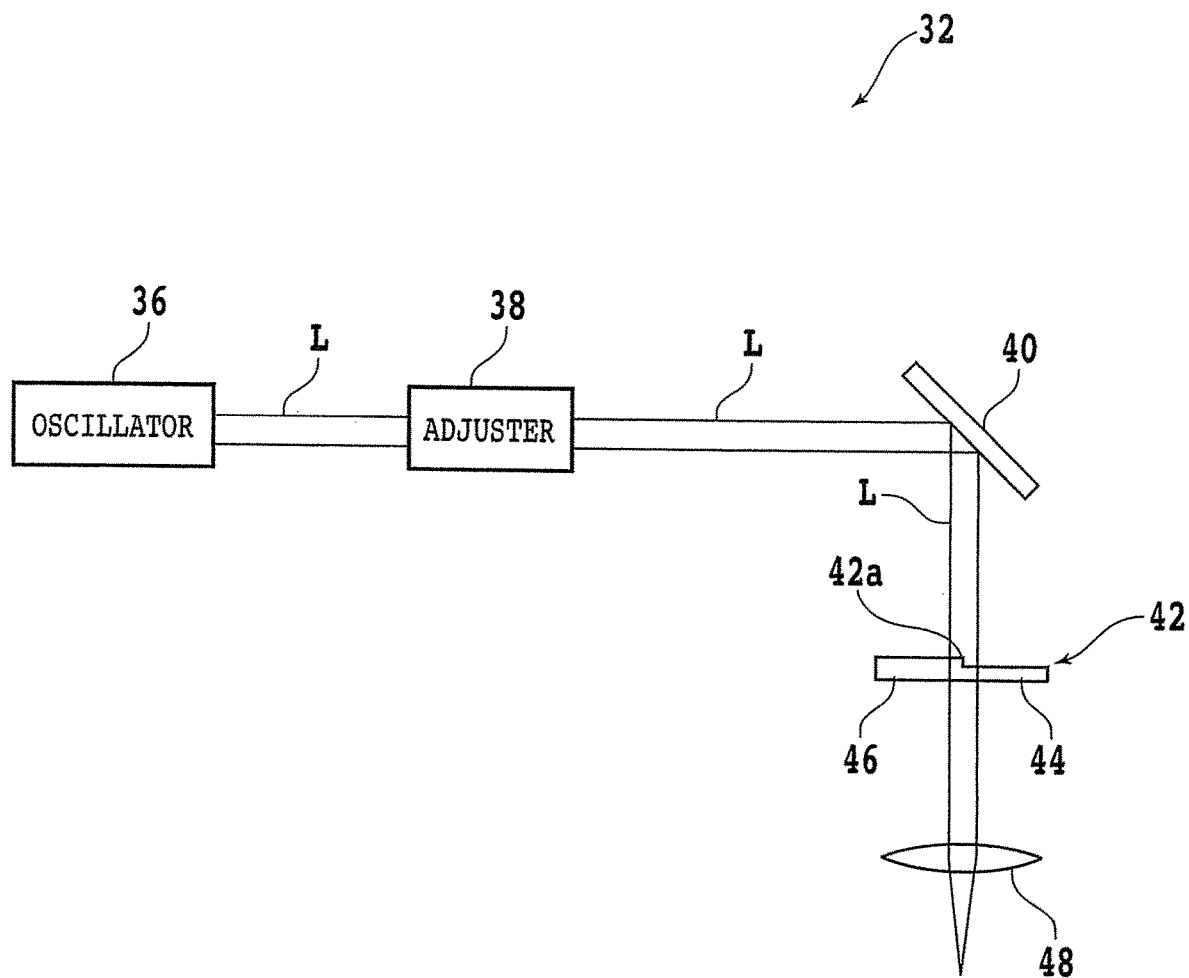
FIG. 2 is a diagram schematically depicting an example of a configuration of a laser beam irradiating unit.

FIG. 2 is a diagram schematically depicting an example of a configuration of the laser beam irradiating unit 32. The laser beam irradiating unit 32 includes an oscillator (laser oscillator) 36 that performs pulse oscillation of a laser beam L having a wavelength transmissible through the wafer 11. An adjuster 38 that adjusts an amount of light of the laser beam L oscillated by the oscillator 36 is disposed at a position adjacent to the oscillator 36.

Figure 3A:
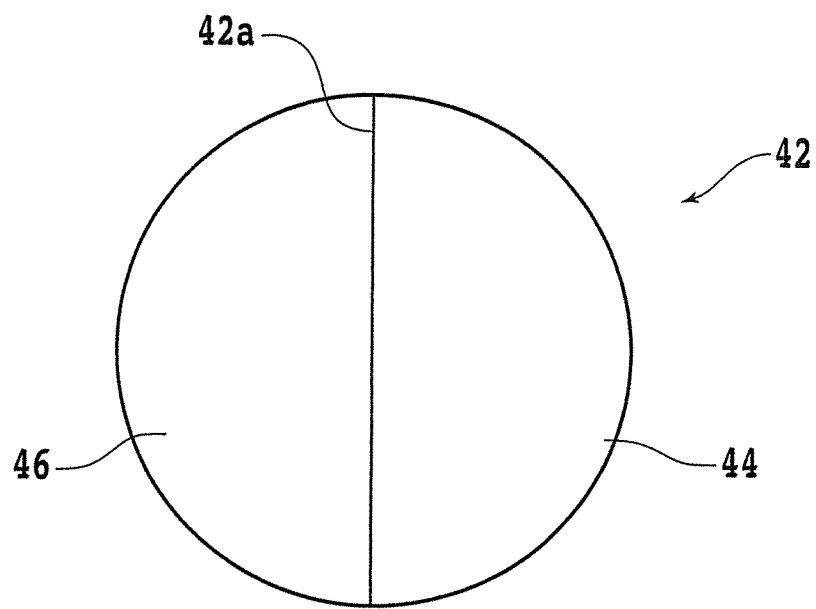
FIG. 3A is a plan view schematically depicting an example of a configuration of a phase shift mask.
Figure 3B:
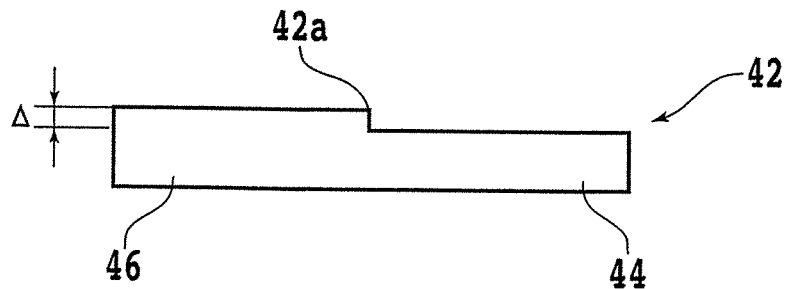
FIG. 3B is a side view schematically depicting the example of the configuration of the phase shift mask.

The laser beam L whose light amount is adjusted by the adjuster 38 is, for example, reflected by a mirror 40, and thereafter enters a phase shift mask 42. FIG. 3A is a plan view schematically depicting an example of a configuration of the phase shift mask 42. FIG. 3B is a side view schematically depicting the example of the configuration of the phase shift mask 42.

As depicted in FIG. 3A and FIG. 3B, the phase shift mask 42 is, for example, a Levenson mask formed in a disk shape including a first region 44 having a predetermined thickness and a second region 46 thicker than the first region 44. A boundary 42a between the first region 44 and the second region 46 is, for example, set in a radial direction of the phase shift mask 42.

A thickness difference $\Delta$ between the first region 44 and the second region 46 is adjusted such that a phase difference of 180 degrees ($\pi$) can be formed between the laser beam L passing (transmitting) through the first region 44 and the laser beam L passing (transmitting) through the second region 46. Here, letting $n_1$ be the index of refraction of air, letting $n_2$ be the index of refraction of a material constituting the phase shift mask 42, and letting $\lambda$ be the wavelength of light in a vacuum, a condition for a 180 degrees ($\pi$) phase shift of light is expressed by $n_1\Delta - n_2\Delta = (2m-1)\cdot\lambda\cdot\pi/2\pi$ (where m is a positive integer).

Hence, in a case where the wavelength of the laser beam L is 1064 nm and the material constituting the phase shift mask 42 is quartz glass, for example, considering that the index of refraction of air is approximately 1.00 and the index of refraction of quartz glass is approximately 1.45 at 20° C., a pressure of one atmosphere, and a wavelength of 1064 nm, the thickness difference $\Delta$ is approximately 1180 (2m−1) (nm). That is, $\Delta$ is approximately 1.18 μm, approximately 3.54 μm, approximately 5.90 μm, or the like.

Similarly, in a case where the wavelength of the laser beam L is 1342 nm and the material constituting the phase shift mask 42 is quartz glass, for example, considering that the index of refraction of air is approximately 1.00 and the index of refraction of quartz glass is approximately 1.45 at 20° C., a pressure of one atmosphere, and a wavelength of 1342 nm, the thickness difference $\Delta$ is approximately 1490 (2m−1) (nm). That is, $\Delta$ is approximately 1.49 μm, approximately 4.47 μm, approximately 7.45 μm, or the like.

Figure 4:
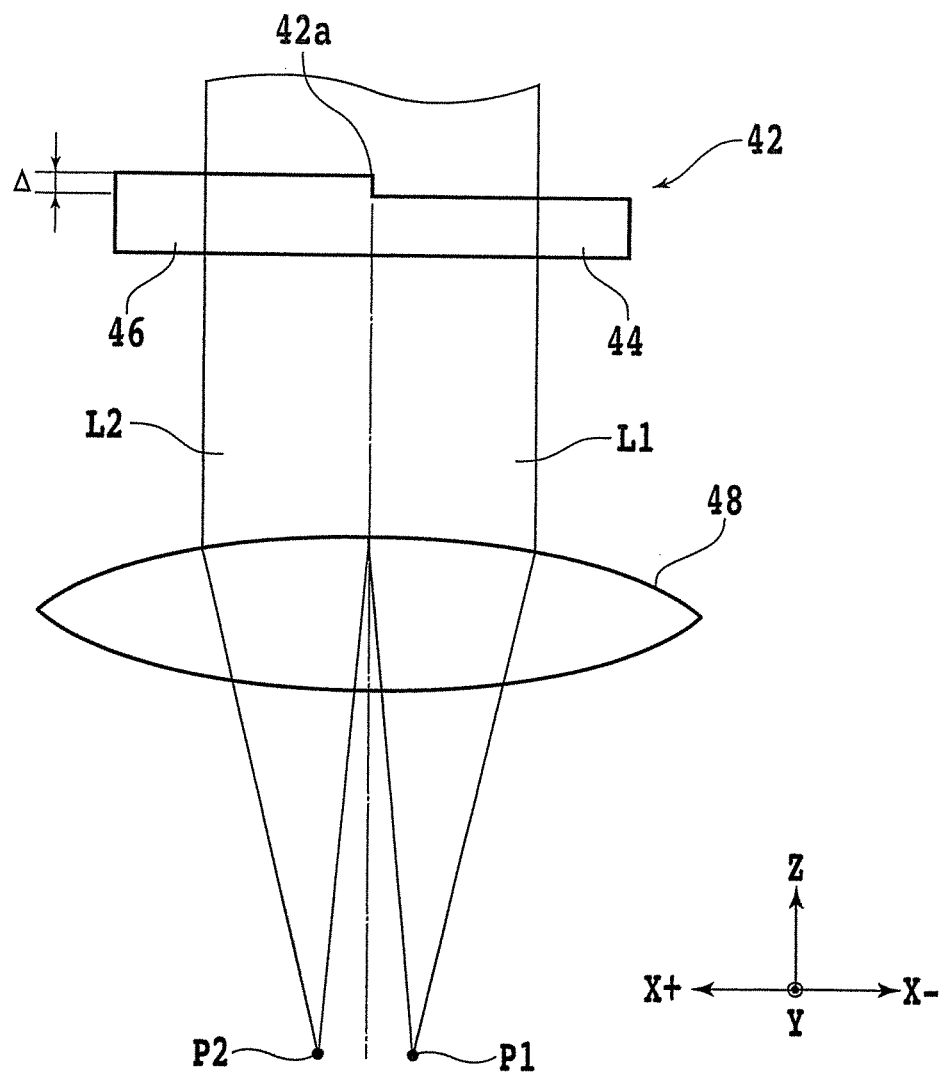

FIG. 4 is a diagram schematically depicting the state of the laser beam L passing through the phase shift mask 42 and the like. As depicted in FIG. 4, the laser beam L is divided into a first laser beam L1 and a second laser beam L2 having a phase difference of 180 degrees ($\pi$) from each other by passing through the phase shift mask 42. More specifically, the phase of the second laser beam L2 passed through the thick second region 46 is delayed by 180 degrees ($\pi$) with respect to the phase of the first laser beam L1 passed through the thin first region 44.

The laser beam L (each of the first laser beam L1 and the second laser beam L2) passed through the phase shift mask 42 is condensed by a lens (condenser) 48. Because of the presence of the phase difference of 180 degrees ($\pi$) between the first laser beam L1 and the second laser beam L2, the first laser beam L1 and the second laser beam L2 attenuate each other in a region corresponding to the boundary 42a of the phase shift mask 42 (in the vicinity of a boundary between the first laser beam L1 and the second laser beam L2).

As a result, the first laser beam L1 and the second laser beam L2 are condensed by the lens 48 so as to have two peaks P1 and P2. That is, the intensity distribution of the laser beam L condensed by the lens 48 has the two peaks P1 and P2 separated from each other. In the laser processing apparatus 2 according to the present embodiment, the orientation of the phase shift mask 42 or the like is adjusted such that the two peaks P1 and P2 are arranged along the X-axis direction.

Figure 5:
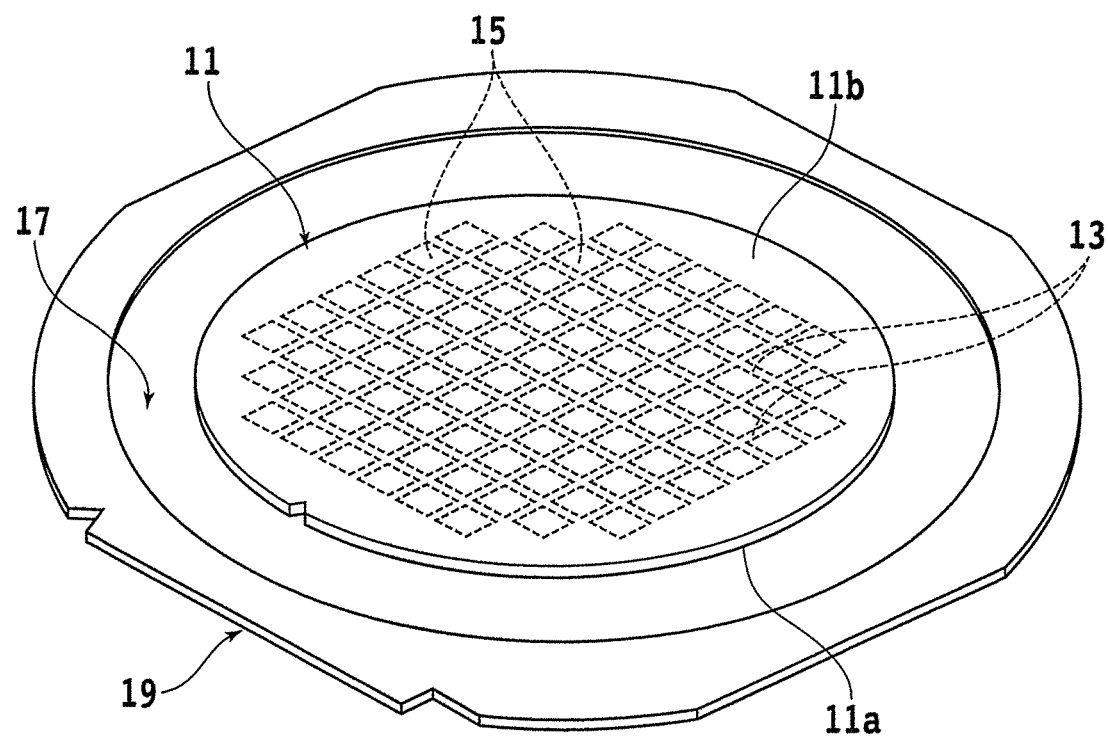

FIG. 5 is a perspective view schematically depicting an example of a configuration of the wafer 11 processed by the wafer processing method according to the present embodiment and the like. The wafer 11 is, for example, formed in a disk shape by a semiconductor material such as silicon or the like. The front surface 11a side of the wafer 11 is divided into a plurality of regions by a plurality of intersecting planned dividing lines (streets) 13. A device 15 such as an IC (Integrated Circuit) or the like is formed in each of the regions.

In addition, an adhesive tape (dicing tape) 17 having a larger diameter than the wafer 11 is affixed to the front surface 11a side of the wafer 11. The annular frame 19 is fixed to an outer circumferential portion of the adhesive tape 17. A back surface 11b side of the wafer 11 is exposed. That is, the wafer 11 is supported by the frame 19 via the adhesive tape 17.

Incidentally, while the disk-shaped wafer 11 formed of a semiconductor material such as silicon or the like is used in the present embodiment, the material, shape, structure, size, and the like of the wafer 11 are not limited. For example, a substrate formed of a material such as another semiconductor, a ceramic, a resin, a metal, or the like can also be used as the wafer 11. In addition, the kind, quantity, shape, structure, size, arrangement, and the like of the devices 15 are not limited either.

The wafer processing method according to the present embodiment first performs the modified layer forming step of forming a modified layer (modified region) within the above-described wafer 11. The modified layer forming step includes a holding step, a forward path modified layer forming step, a phase shift mask reversing step, and a backward path modified layer forming step.

In the holding step, the chuck table 6 of the laser processing apparatus 2 described above sucks and holds the wafer 11. Specifically, the adhesive tape 17 affixed to the front surface 11a side of the wafer 11 is brought into contact with the holding surface 6a of the chuck table 6, and a negative pressure of the suction source is made to act. In addition, the frame 19 is fixed by the clamps 6b of the chuck table 6. Thus, the wafer 11 is sucked and held on the chuck table 6 in a state in which the back surface 11b side of the wafer 11 is exposed upward.

Figure 6A:
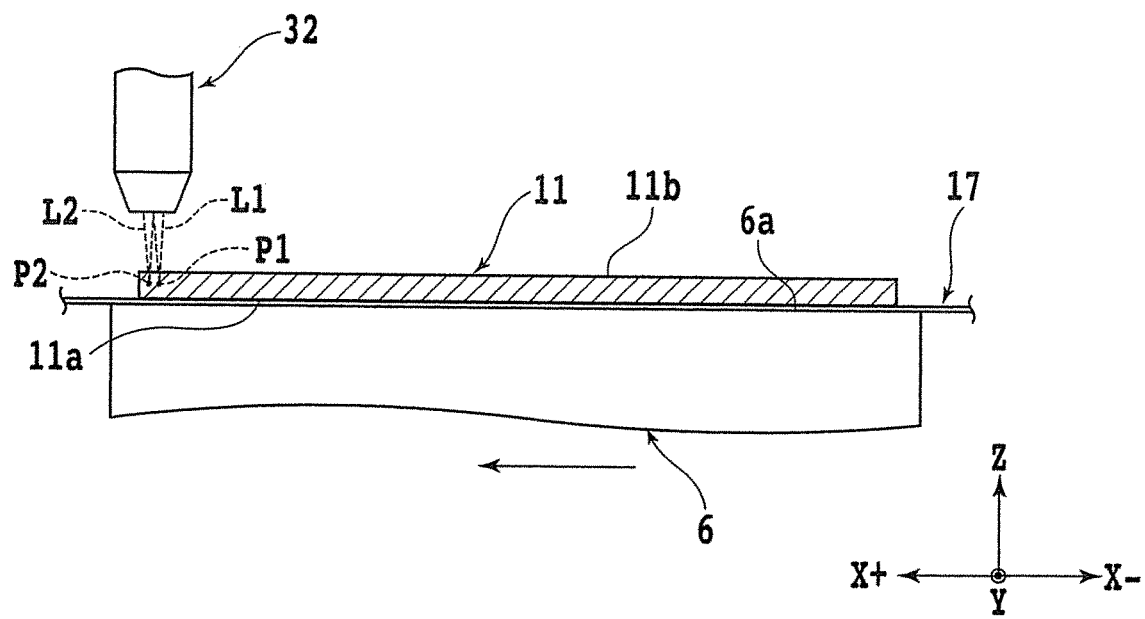
FIG. 6A and FIG. 6B are partially sectional side views schematically depicting a state in which modified layers are formed within the wafer in a forward path modified layer forming step.
Figure 6B:
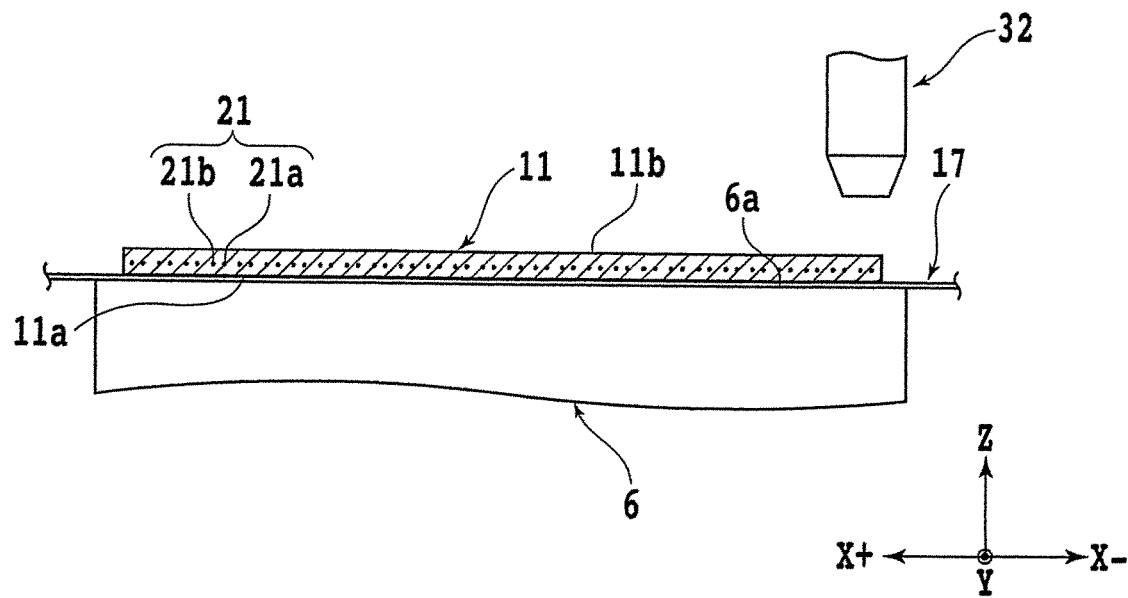
Figure 7:
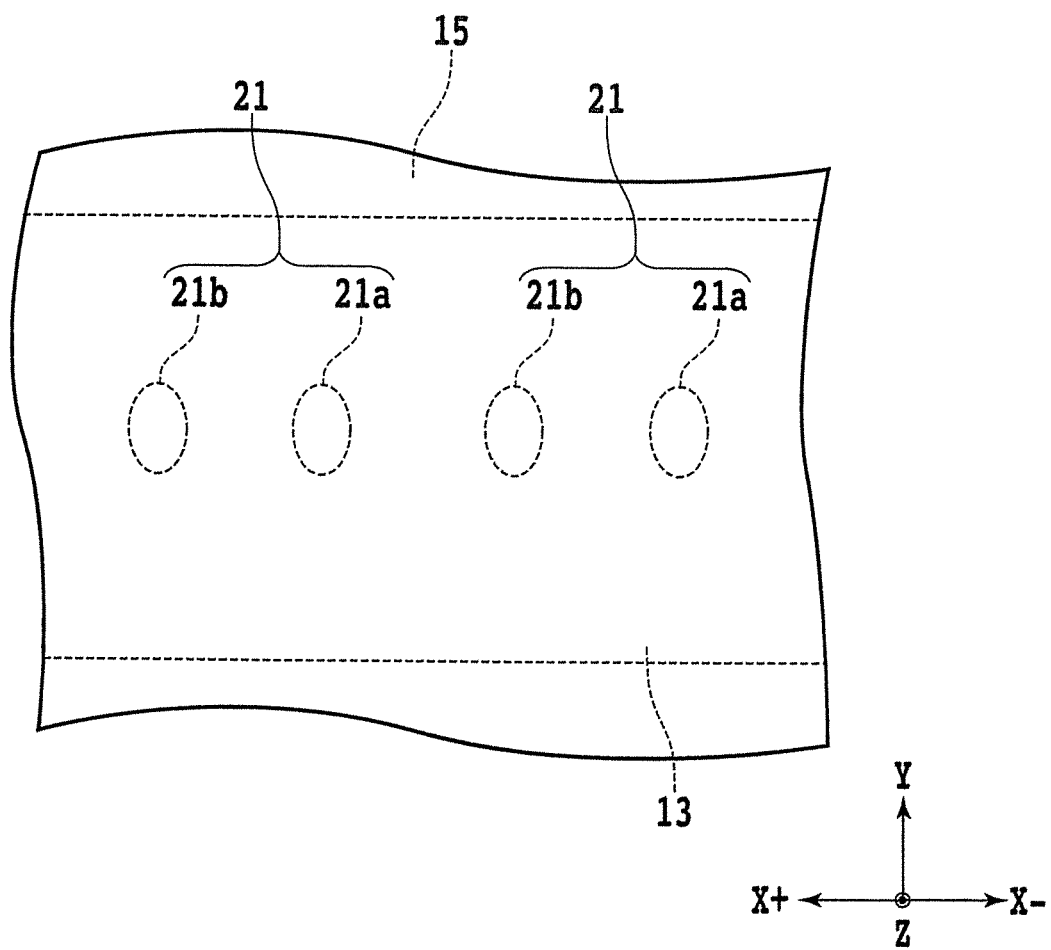

After the holding step, the forward path modified layer forming step, for example, is performed. FIG. 6A and FIG. 6B are partial sectional side views schematically depicting a state in which modified layers 21 are formed within the wafer 11 in the forward path modified layer forming step. FIG. 7 is a plan view schematically depicting the arrangement of the modified layers 21 and the like. In the forward path modified layer forming step, first, a target planned dividing line 13, for example, is made parallel with the X-axis direction by rotating the chuck table 6.

Next, the chuck table 6 is moved to adjust the position of an emitting port of the laser beam irradiating unit 32 right above an extension of the planned dividing line 13 as a processing target. Then, as depicted in FIG. 6A, the chuck table 6 is moved to an X+ side (other side in the X-axis direction) while the wafer 11 is irradiated with the laser beam L (the first laser beam L1 and the second laser beam L2) from the laser beam irradiating unit 32.

In other words, the laser beam irradiating unit 32 is moved to an X− side (one side in the X-axis direction) relative to the chuck table 6 while the wafer 11 is irradiated with the laser beam L from the laser beam irradiating unit 32.

In addition, the laser beam irradiating unit 32 is adjusted and controlled such that the laser beam L is condensed within the wafer 11. When the laser beam L having a wavelength transmissible through the wafer 11 is thus condensed within the wafer 11, the wafer 11 is modified by multiphoton absorption in a region in which the laser beam L is condensed (that is, at the peaks P1 and P2) and in the vicinity thereof, so that the modified layers 21 (modified layers 21a and 21b) serving as a starting point of division can be formed.

Concrete processing conditions are as follows, for example.

Wavelength of the laser beam L: 1064 nm or 1342 nm
Repetition frequency: 90 kHz
Feed speed (processing feed speed) of the chuck table 6: 500 mm/s
Numerical aperture (NA) of the lens 48: 0.7
Energy of the laser beam L per pulse: 12 µJ
Interval between the peak P1 and the peak P2: 1 µm to 2 µm However, there are no particular limitations to the processing conditions. For example, in the case where the wafer 11 formed of a semiconductor material such as silicon or the like is processed, it is also possible to use a laser beam L of another wavelength in a range of 900 to 1500 nm both inclusive, preferably in a range of 1000 to 1100 nm both inclusive or in a range of 1300 to 1400 nm both inclusive. The forward path modified layer forming step is ended after the modified layers 21 are formed along the planned dividing line 13 as a processing target, as depicted in FIG. 6B and FIG. 7.

In the forward path modified layer forming step according to the present embodiment, as depicted in FIG. 6A, the orientation of the phase shift mask 42 or the like is adjusted so as to delay the phase of the second laser beam L2 forming the peak P2 on the X+ side (the other side in the X-axis direction) with respect to the phase of the first laser beam L1 forming the peak P1 on the X− side (one side in the X-axis direction) by 180 degrees ($\pi$). It is thereby possible to prevent destruction of the devices 15 by the laser beam L (the first laser beam L1 and the second laser beam L2) reflected and dispersed within the wafer 11.

When a direction in which cracks extend is controlled by the two peaks P1 and P2 of the laser beam L, a possibility of the cracks extending in random directions from the modified layers 21 is reduced, and the reflection and dispersion of the laser beam L due to the random cracks are suppressed, so that destruction of the devices 15 can be prevented.

Figure 8:
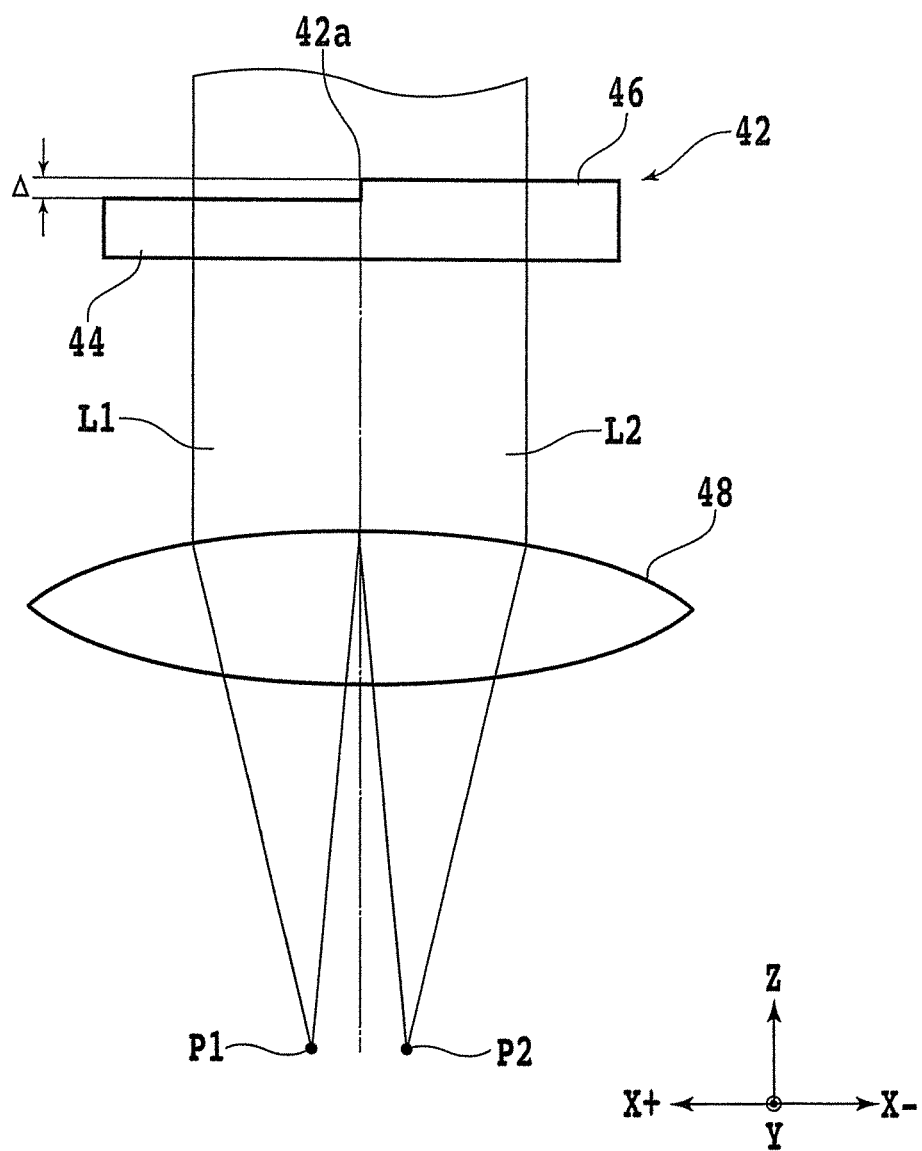
FIG. 8 is a diagram schematically depicting a state after the phase shift mask is reversed in a phase shift mask reversing step.

After the forward path modified layer forming step, the phase shift mask reversing step is performed which reverses the phase shift mask 42 so that the phase distribution of the laser beam L applied to the wafer 11 is reversed in the X-axis direction. FIG. 8 is a diagram schematically depicting a state after the phase shift mask 42 is reversed in the phase shift mask reversing step.

In the phase shift mask reversing step, for example, the phase distribution of the laser beam L applied to the wafer 11 is reversed in the X-axis direction by rotating the phase shift mask 42 by 180 degrees about a rotation axis parallel with the traveling direction of the laser beam L. As a result, as depicted in FIG. 8, the phase of the second laser beam L2 forming the peak P2 on the X− side (one side in the X-axis direction) is delayed by 180 degrees ($\pi$) with respect to the phase of the first laser beam L1 forming the peak P1 on the X+ side (the other side in the X-axis direction).

Figure 9A:
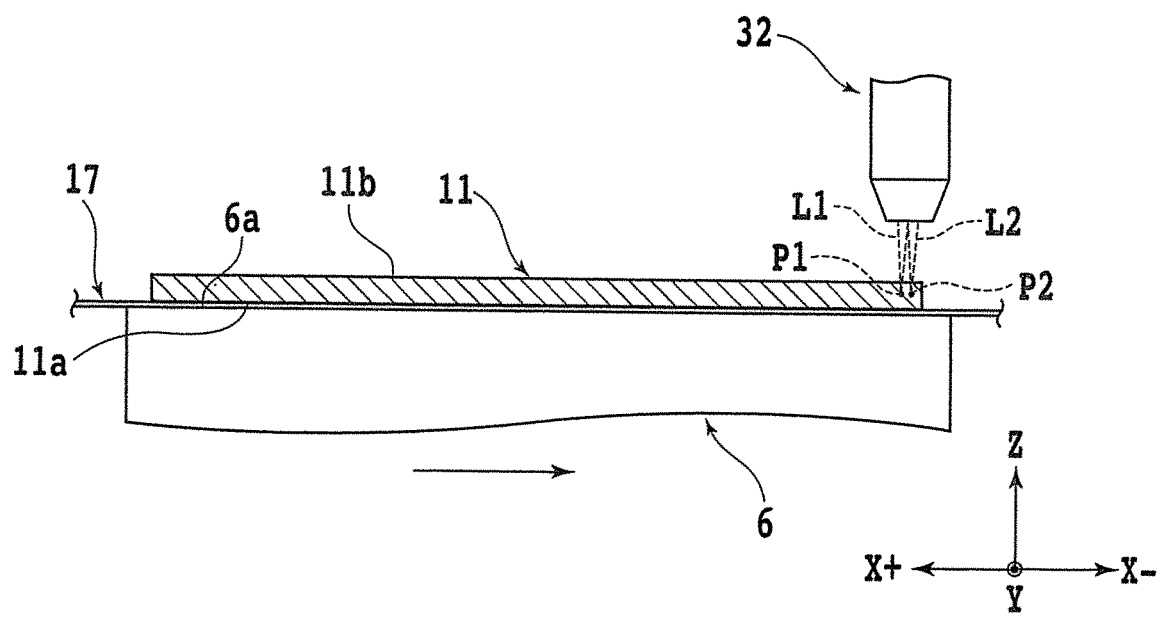
FIG. 9A and FIG. 9B are partially sectional side views schematically depicting a state in which modified layers are formed within the wafer in a backward path modified layer forming step.
Figure 9B:
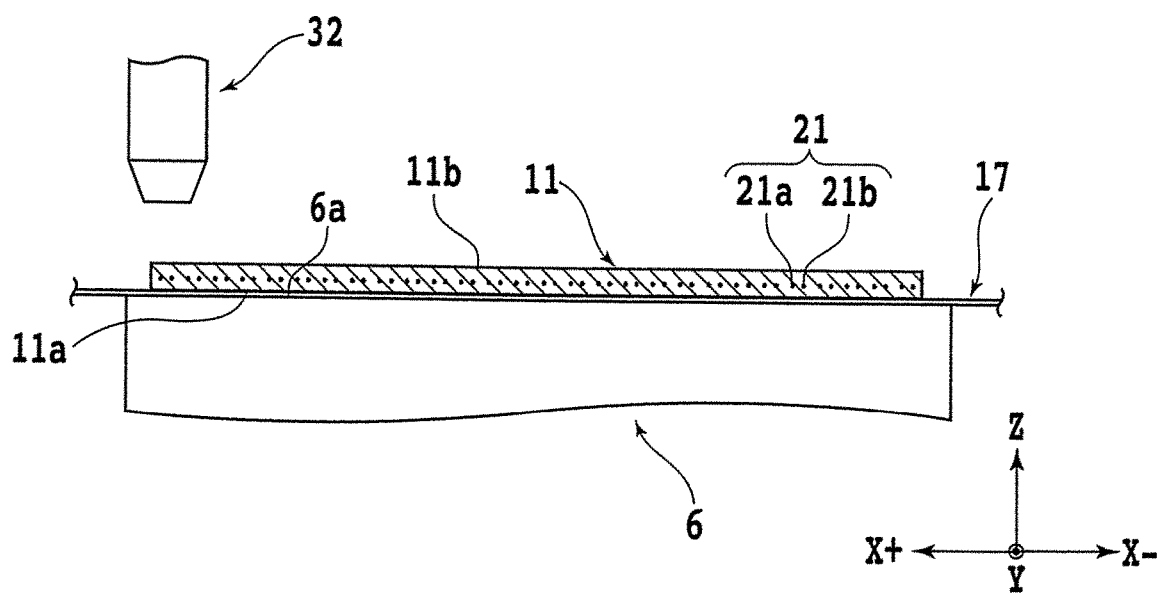

After the phase shift mask reversing step, the backward path modified layer forming step is performed. FIG. 9A and FIG. 9B are partially sectional side views schematically depicting a state in which the modified layers 21 are formed within the wafer 11 in the backward path modified layer forming step. In the backward path modified layer forming step, first, the chuck table 6 is moved to adjust the position of the emitting port of the laser beam irradiating unit 32 right above an extension of a planned dividing line 13 as a processing target (for example, a planned dividing line 13 adjacent to the planned dividing line 13 set as a processing target in the forward path modified layer forming step).

Then, as depicted in FIG. 9A, the chuck table 6 is moved to the X− side (one side in the X-axis direction) while the wafer 11 is irradiated with the laser beam L (the first laser beam L1 and the second laser beam L2) from the laser beam irradiating unit 32. In other words, the laser beam irradiating unit 32 is moved to the X+ side (the other side in the X-axis direction) relative to the chuck table 6 while the wafer 11 is irradiated with the laser beam L from the laser beam irradiating unit 32.

In addition, the laser beam irradiating unit 32 is adjusted and controlled such that the laser beam L is condensed within the wafer 11. When the laser beam L having a wavelength transmissible through the wafer 11 is thus condensed within the wafer 11, the wafer 11 is modified by multiphoton absorption in a region in which the laser beam L is condensed (that is, at the peaks P1 and P2) and in the vicinity thereof, so that modified layers 21 (modified layers 21a and 21b) serving as a starting point of division can be formed.

Concrete processing conditions may be the same as in the forward path modified layer forming step. However, there are no particular limitations to the processing conditions. The backward path modified layer forming step is ended after the modified layers 21 are formed along the planned dividing line 13 as a processing target, as depicted in FIG. 9B.

In the backward path modified layer forming step according to the present embodiment, as depicted in FIG. 9A, the orientation of the phase shift mask 42 or the like is adjusted so as to delay the phase of the second laser beam L2 forming the peak P2 on the X− side (one side in the X-axis direction) with respect to the phase of the first laser beam L1 forming the peak P1 on the X+ side (the other side in the X-axis direction) by 180 degrees ($\pi$). It is thereby possible to prevent destruction of the devices 15 by the laser beam L (the first laser beam L1 and the second laser beam L2) reflected and dispersed within the wafer 11.

In addition, in the wafer processing method according to the present embodiment the phase shift mask 42 is reversed by performing the phase shift mask reversing step after the forward path modified layer forming step and before the backward path modified layer forming step. The phase distribution of the laser beam L applied to the wafer 11 is thereby reversed in the X-axis direction. Thus, even when the direction of relative movement between the chuck table 6 and the laser beam irradiating unit 32 is changed, the wafer 11 can be processed with high precision under uniform processing conditions.

Incidentally, after the backward path modified layer forming step, the phase shift mask reversing step may be further performed, and thereafter the forward path modified layer forming step, the phase shift mask reversing step, the backward path modified layer forming step, and the phase shift mask reversing step may be repeated as required. The modified layer forming step is ended after modified layers 21 are formed along all of the planned dividing lines 13.

After the modified layer forming step, the dividing step is performed which divides the wafer 11 along the planned dividing lines 13 in which the modified layers 21 are formed. In the dividing step, the wafer 11 is fractured and divided with the modified layers 21 as a starting point by applying a force to the wafer 11 by an arbitrary method. Incidentally, there is no particular limitation to the method of applying the force to the wafer 11.

For example, the wafer 11 can be divided by applying the force by a method of expanding the adhesive tape 17. In addition, the wafer 11 may be divided by applying the force by a method of grinding the back surface 11b side of the wafer 11, a method of pressing a rod-shaped (edge-shaped) member along the planned dividing lines 13, or the like. The dividing step is ended after the wafer 11 is divided along all of the planned dividing lines 13.

It is to be noted that the present invention is not limited to the description of the foregoing embodiment, but can be modified and carried out in various manners. For example, while the laser processing apparatus 2 according to the foregoing embodiment uses a Levenson mask as the phase shift mask 42, a spatial phase modulator typified by a LCOS-SLM (Liquid Crystal on Silicon-Spatial Light Modulator) or the like may be used as a phase shift mask.

In addition, the laser processing apparatus 2 according to the foregoing embodiment adopts the laser beam irradiating unit (laser beam irradiating means) 32 having a configuration in which the laser beam L is reflected by the mirror 40 before entering the phase shift mask 42. However, there is no particular limitation to the arrangement or the like of the constituent elements constituting the laser beam irradiating unit. For example, the laser beam irradiating unit can also be configured such that the laser beam passed through the phase shift mask is reflected by the mirror.

In addition, in the forward path modified layer forming step of the foregoing embodiment, the laser beam irradiating unit 32 is moved to the X− side relative to the chuck table 6 while irradiating the wafer 11 with the laser beam L. However, the present invention is not limited to this mode. For example, in the forward path modified layer forming step, the laser beam irradiating unit 32 may be moved to the X+ side relative to the chuck table 6 while irradiating the wafer 11 with the laser beam L. That is, relation between X− and X+ can be interchanged.

In addition, another modified layer forming step may be additionally performed after the modified layer forming step of the foregoing embodiment and before the dividing step of the foregoing embodiment. For example, after the modified layers 21 are formed at a first depth position of the wafer 11 in the modified layer forming step of the foregoing embodiment, additional modified layers can be formed at a second depth position of the wafer 11 in another modified layer forming step. In this case, the phase shift mask 42 does not necessarily need to be used in the other modified layer forming step.

In addition, the structure, the method, and the like according to the foregoing embodiment can be modified and carried out as appropriate without departing from the scope of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for processing a wafer having a device formed in each region of a front surface side demarcated by a plurality of planned dividing lines, by using a laser processing apparatus, the laser processing apparatus including a chuck table configured to hold the wafer, a laser beam irradiating unit configured to form a modified layer within the wafer by irradiating the wafer held on the chuck table with a laser beam of a wavelength transmissible through the wafer, and a horizontal moving mechanism configured to move the chuck table and the laser beam irradiating unit relative to each other in an X-axis direction,
   the laser beam irradiating unit including
      a laser oscillator configured to perform pulse oscillation of the laser beam,
      a condenser configured to condense the laser beam oscillated by the laser oscillator and irradiate the wafer with the laser beam, and
      a phase shift mask disposed between the laser oscillator and the condenser, the phase shift mask forming a phase difference of 180 degrees between a part of the laser beam guided to the condenser and a remaining part of the laser beam guided to the condenser such that intensity distribution of the laser beam applied to the wafer has two peaks separated from each other in the X-axis direction,
   the wafer processing method comprising:
   a modified layer forming step of forming the modified layer along a planned dividing line within the wafer by moving the chuck table and the laser beam irradiating unit relative to each other in the X-axis direction while irradiating a region corresponding to the planned dividing line of the wafer with the laser beam from a back surface side of the wafer under a condition for condensing the laser beam within the wafer; and
   a dividing step of dividing the wafer along the planned dividing line with the modified layer as a starting point by applying a force to the wafer after the modified layer forming step is performed;
   the modified layer forming step including
      a forward path modified layer forming step of irradiating the wafer with the laser beam while moving the laser beam irradiating unit to one side in the X-axis direction relative to the chuck table,
      a backward path modified layer forming step of irradiating the wafer with the laser beam while moving the laser beam irradiating unit to another side in the X-axis direction relative to the chuck table, and
      a phase shift mask reversing step of reversing the phase shift mask so as to reverse phase distribution of the laser beam applied to the wafer in the X-axis direction after the forward path modified layer forming step and before the backward path modified layer forming step, or after the backward path modified layer forming step and before the forward path modified layer forming step.

2. The wafer processing method according to claim 1, wherein in the forward path modified layer forming step, the phase shift mask delays, by 180 degrees, a phase of the laser beam forming the peak on the other side in the X-axis direction with respect to a phase of the laser beam forming the peak on the one side in the X-axis direction, and in the backward path modified layer forming step, the phase shift mask delays, by 180 degrees, the phase of the laser beam forming the peak on the one side in the X-axis direction with respect to the phase of the laser beam forming the peak on the other side in the X-axis direction.

3. The wafer processing method according to claim 1, wherein a wavelength of the laser beam oscillated by the laser oscillator is between 1300 nm and 1400 nm both inclusive.

* * * * *